United States Patent [19]

Blanchard et al.

[11] 4,145,703
[45] Mar. 20, 1979

[54] HIGH POWER MOS DEVICE AND FABRICATION METHOD THEREFOR

[75] Inventors: Richard A. Blanchard, Sunnyvale; Benedict C. K. Choy, Campbell, both of Calif.

[73] Assignee: Supertex, Inc., Sunnyvale, Calif.

[21] Appl. No.: 787,788

[22] Filed: Apr. 15, 1977

[51] Int. Cl.² .......................................... H01L 29/06
[52] U.S. Cl. ...................................... 357/55; 357/23; 357/54; 357/59
[58] Field of Search ................... 357/23, 55, 54, 59

[56] References Cited

U.S. PATENT DOCUMENTS

| 3,798,514 | 3/1974 | Hayashi et al. ................. 357/23 |
| 3,975,221 | 8/1976 | Rodgers ........................... 357/23 |
| 4,048,649 | 9/1977 | Bohn ............................... 357/55 |
| 4,070,690 | 1/1978 | Wickstrom ...................... 357/55 |

*Primary Examiner*—Edward J. Wojciechowicz
*Attorney, Agent, or Firm*—Harry M. Weiss

[57] ABSTRACT

This disclosure relates to a high power VMOS semiconductor device and fabrication method therefor. This VMOS semiconductor device uses a doped polysilicon gate electrode in the V groove and an overlying metal electrode located over an insulation layer protecting the doped polysilicon gate electrode. This overlying metal electrode layer covers substantially the entire surface area (except for a small area where electrical contact is made to the doped polysilicon gate electrode) of one surface of the device. Another embodiment discloses the use of a self-aligned metal contact to the source or drain region of the VMOS device between adjacent V grooves.

14 Claims, 5 Drawing Figures

HIGH POWER MOS DEVICE AND FABRICATION METHOD THEREFOR

BACKGROUND OF THE INVENTION

1. Field of the Invention

This invention relates generally to high power semiconductor devices, and more specifically, to high power MOS devices preferably in discrete form and fabrication methods therefor.

2. Description of the Prior Art

In the past, high power semiconductor devices were generally fabricated as bipolar discrete devices. Generally, these high power bipolar discrete devices were customarily NPN type transistors although some high power devices were made using PNP type transistors or thyristors which were either of NPNP or PNPN type. In addition, for some applications, high power semiconductor diodes of either NP or PN type were also fabricated and used as high power devices.

However, as the semiconductor technology developed, people in the industry recognized a need to develop reliable, high power, MOS type semiconductor devices especially because of the use of fewer fabrication steps and generally simpler design. One advantage of a metal-oxide-silicon (MOS) semiconductor device as contrasted with a bipolar semiconductor device is that generally less diffusion steps are required to make the MOS device and, consequently, it is generally less costly to produce large volumes of these types of devices. MOS type semiconductor devices are basically field effect transistor devices and considered as "unipolar" type devices as contrasted with the "bipolar" conventional semiconductor transistor devices. Furthermore, high power bipolar discrete devices have become fairly complex because of the use, in many cases, of extra features or steps such as diffused guard rings in the semiconductor substrate surface and field relief electrodes located on the insulating surface of the bipolar discrete device.

Recently, in various development programs created to produce high power discrete MOS type semiconductor devices, there has been very serious device design and manufacturing problems associated with reliably producing in heavy volume, high power MOS discrete devices.

One of the problems associated with making a reliable, high power, MOS type discrete device has been the need to develop a MOS semiconductor structure which would have a design that would permit the formation of a large metal heat sink coating that would cover substantially one entire surface portion of the MOS semiconductor device to permit large amounts of current to be carried by the high power, MOS device.

Another problem associated with the development of high power, MOS discrete semiconductor devices is to reliably produce large quantities of these devices with high device yields which would greatly reduce the cost for these types of devices. This has become a very serious problem because it became apparent to developers of these high power MOS devices that conventional, planar type gate electrode structures could not be used. In order to form a high power or high current carrying MOS discrete device, it is necessary to understand that the current of any MOS device ($I_D$) is directly proportional to the value Z which is the longitudinal dimension of the channel region between the source and drain regions of the MOS device and is inversely proportional to the dimension L which is the transverse distance between the source and drain regions of the MOS device.

The dimension L cannot be made smaller than about 3 microns due to both the problem created by photoresist limitations and because of the problem associated with the relatively unpredictable extent of sideways diffusions when a conventional source and drain diffused region is formed in a standard MOS device design. However, the semiconductor technology has developed an alternate way to produce more precise and accurate differences using certain other diffused regions such as the very narrow base widths that have been formed between emitter and collector regions of a bipolar transistor structure after emitter and base diffusions. Thus, vertical differences obtained by using diffused regions in a vertical direction can be made as small as about 1 micron. Accordingly, development of MOS structures using this 1 micron difference in a vertical dimension to form a gate region therein has recently become important to close the transverse spacing between source and drain regions thereby reducing the L of the FET structure which increases the device current $I_D$.

One type of MOS device that has been made in the past in an attempt to further improve MOS structures is a D-MOS device. A D-MOS device is fabricated by performing sequential diffusions in the same opening in the silicon dioxide. The channel length L is thus the difference between these two diffusions. D-MOS devices offer advantages over conventional MOS devices, but the current density is still too small for a power MOSFET.

In order to increase the Z of the MOS device which would thereby create a direct proportional increase in the current $I_D$ that can be carried by the device, it was found expedient to form a sinuous MOS structure in order to significantly increase the Z value of the device by having longer source and drain regions.

Consequently, in order to maximize Z and minimize L, it was deemed necessary to develop MOS structures that did not use conventional planar gates, the usual source and drain regions nor the standard contacts to source and drain regions. One very recent MOS type structure that was developed used a V-shaped groove through a diffused heavily doped region (which functioned as the source or drain region after being split by the V-shaped groove); however, the metal gate electrode (usually of aluminum) formed on an insulating layer located on the V-shaped groove was not reliable due to the great difficulty in providing a continuous metal layer onto the V-shaped groove's insulation layer surface. Tiny cracks across the metal layer formed in the recess portion of the V-shaped groove prevented the metal gate electrode from performing its usual channel formation function between source and drain regions.

Accordingly, the need existed to develop very reliable, high power, MOS discrete devices which would have the significant advantage of high current carrying capacity and reliable V-shaped gate electrodes.

SUMMARY OF THE INVENTION

Figure 1:
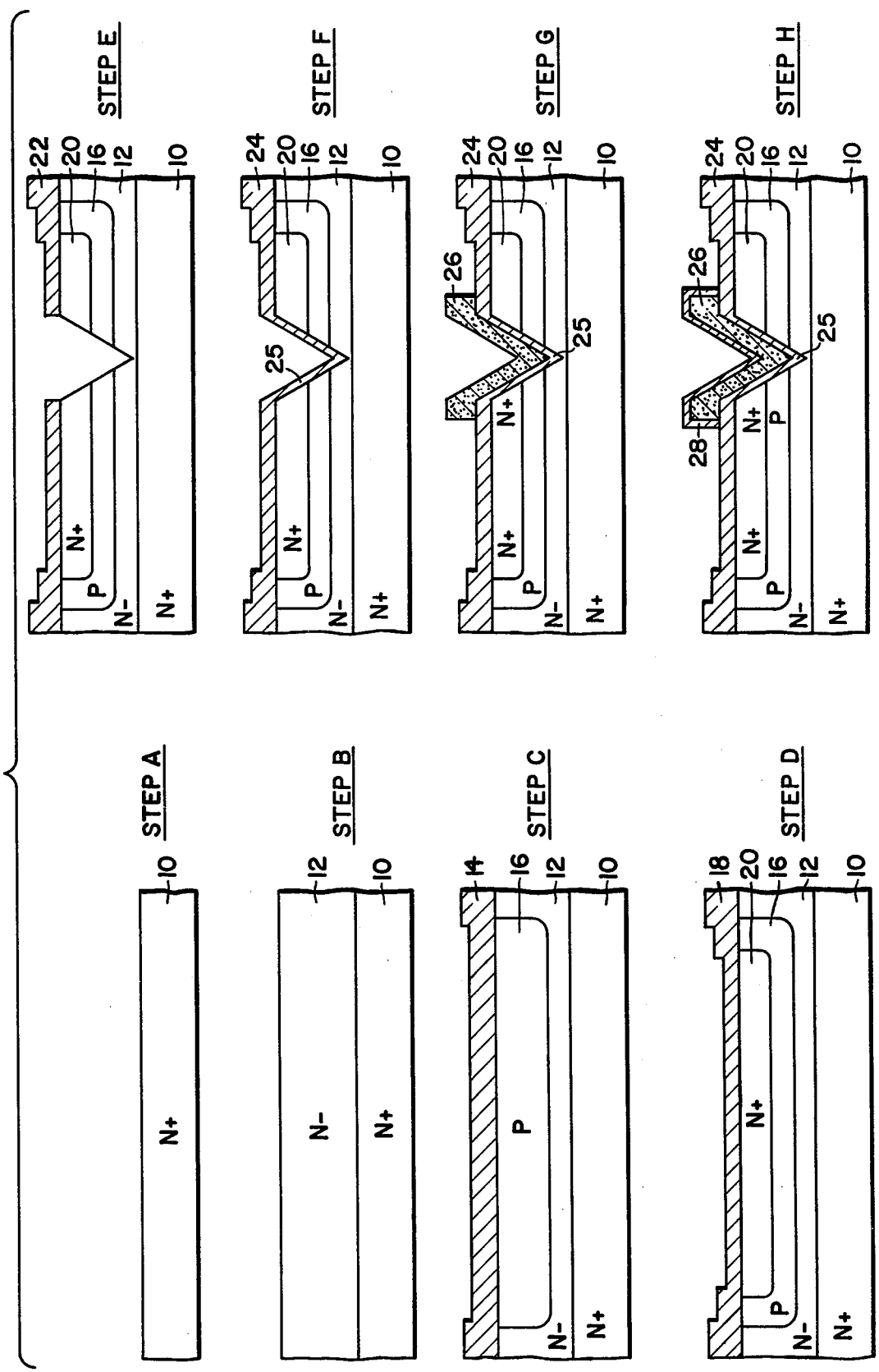
FIG. 1 is a series of Steps A through H showing elevational views, in cross-section, of the successive steps of manufacture of a MOS device in accordance with one embodiment of the present invention.

In accordance with one embodiment of this invention, it is an object of this invention to provide an improved high power MOS semiconductor device that can be made as either a P channel or N channel device.

It is another object of this invention to provide an improved high power discrete MOS semiconductor device.

It is still a further object of this invention to provide an improved high power discrete MOS semiconductor device having an improved V-shaped gate electrode.

It is still a further object of this invention to provide an improved high power discrete MOS semiconductor device having a self-aligned metal contact electrode.

It is still a further object of this invention to provide a method for making an improved high power MOS semiconductor device that has a V-shaped gate electrode.

It is still another object of this invention to provide a method for making an improved high power MOS semiconductor device that has a self-aligned metal contact electrode.

DESCRIPTION OF THE PREFERRED EMBODIMENTS

In accordance with one embodiment of the invention, a high power MOS semiconductor device is provided which comprises a semiconductor substrate. Spaced source and drain regions of one conductivity type are located in the semiconductor substrate. A substantially V-shaped channel region having regions thereof of opposite conductivity type that are connected to the source region and to the drain region is located in the semiconductor substrate and provides a groove therein. A first insulating layer is located in the groove in the semiconductor substrate and on the substantially V-shaped channel region. A doped, electrically conductive polysilicon gate electrode layer is located in the groove and on the first insulating layer. A second insulating layer is located on and covers the polysilicon gate electrode layer. A first electrode is electrically connected to one of the source and drain regions and a second electrode is electrically connected to the other of the source and drain regions. One of the first and second electrodes is located on the second insulating layer and covers substantially the entire surface area over one surface of the semiconductor substrate therefor providing a large heat sink. Also, a self-aligned metal contact MOS device is shown.

In accordance with another embodiment of this invention, a method is provided for fabricating a high power MOS semiconductor device. The method includes the steps of forming a V-shaped groove in a semiconductor substrate through both a high conductivity region of one conductivity type and a region of opposite type conductivity that surrounds a substantial portion of the high conductivity region of the one conductivity type. The method also includes the steps of forming a first insulating layer in the V-shaped groove and forming a doped electrically conductive polysilicon gate electrode layer on the surface of the first insulating layer. Further steps of the method include depositing a second insulating layer on the polysilicon gate electrode layer, forming an opening in the second insulating layer to expose a surface portion of the polysilicon gate electrode layer, and depositing electrical contacts to make source and drain connections to regions of the semiconductor substrate and to make electrical contact to the polysilicon gate electrode layer through the opening in the second insulating layer. Alternatively, the method includes the formation of a self-aligned metal contact structure.

The foregoing and other objects, features, and advantages of the invention will be apparent from the following more particular description of the preferred embodiments of the invention as illustrated in the accompanying drawings.

Referring to FIG. 1, Step A depicts a starting semiconductor substrate 10 of N+ type semiconductor (preferably silicon) type material. The semiconductor starting substrate 10 may be obtained from commercial semiconductor wafer fabrication sources or grown as a bar from a suitably N doped melt by conventional crystal growth techniques and then sliced into wafers or substrates. Preferably, the N type impurities in the N+ type substrate 10 have an impurity concentration of at least $10^{20}$ impurities per cubic centimeter. The N type impurities used can be an N type dopant such as phosphorous, arsenic, etc. The thickness of the starting N+ substrate 10 can be the same as the thickness of conventional semiconductor wafers. It should be understood that what is described in the sequence of Steps of the Figures relate to the process steps that affect a single die or discrete chip which would be diced away from a large wafer the rest of which is not shown.

Referring to Step B of FIG. 1, a relatively thin epitaxial layer 12 is grown on the N+ type substrate 10. The epitaxial layer 12 is shown to be of N− type conductivity which means that the epitaxial layer 12 is doped with an N type dopant such as phosphorous or arsenic and has an impurity concentration of about $10^{15}$ impurities per cubic centimeter. This N− epi region functions like its bipolar counterpart and provides a high voltage breakdown barrier function. Preferably, the N− epitaxial layer 12 has a thickness of about 20 microns.

Referring to Step C of FIG. 1, a silicon dioxide layer 14 is formed or deposited on a surface of the N− type epitaxial layer 12 such as by conventional thermal growth techniques. By the use of conventional photolithographic oxide masking and etching techniques, a suitable opening is formed within the silicon dioxide layer 14 and a diffusion operation is carried out with P type impurities to form a P type diffused region 16 located within the N− type epitaxial layer 12. This diffusion operation is substantially the same both as to depth and impurity concentration as a Base type diffusion for conventional bipolar devices.

Referring to Step D of FIG. 1, by employing conventional photolithographic oxide masking and etching techniques, an opening is formed in a thermally regrown silicon dioxide layer 18. This opening is made smaller than the first opening formed in the silicon dioxide layer 14 of Step C. Now, an emitter type diffusion operation is carried out to form an N+ region 20 within the previously diffused P type region 16.

Referring to Step E of FIG. 1, by the use of conventional thermal oxide growth techniques, a silicon dioxide layer 22 is formed across the top surface of the epitaxial layer 12 containing diffused regions 16 and 20. Now, by the use of a standard anisotropic etch, a V-shaped groove is formed through the N+ region 20 and through the P type region 16 into the N− epitaxial layer 12, as shown. By using a 100 crystal plane of silicon, this allows the precise anisotopic etching of V-shaped grooves (or V-grooves) in the top surface of the silicon substrate or wafer, thus resulting in the vertical device cross-section shown in Step E of FIG. 1. This anisotropic etching step is shown to etch a V-shaped groove as is conventional with anisotropic etching because this type of etchant etches silicon quicker vertically than it etches the silicon in a horizontal direction thereby forming the V-shaped groove shown in Step E of FIG. 1.

Referring to Step F of FIG. 1, a thermally grown oxide layer 24 is formed across the top surface of the semiconductor structure. This layer 24 is also formed by conventional thermal growth oxide deposition or formation techniques and the thermally grown silicon dioxide layer 24 extends into the V-shaped groove region on the surface portion thereof as shown in Step F and forms a thin $SiO_2$ gate oxide layer 25.

As can be seen, the gate oxide layer 25 (which is preferably about 1000 Angstroms thick) has its V-shaped portion extending between the two split portions of the N+ region 20 and the two split portions of the P type region 16 (which are connected together at the ends thereof (not shown)). The split N+ regions 20 (which are connected together at the ends thereof (not shown)) provide a single source (or drain) type region and the other drain (or source) type region for the MOS or field effect transistor device that is formed using this structure is provided by both the N− region 12 and the N+ region 10. Thus, the channel region is formed on the two sides of the V groove located in the split P region 16 between the split N+ region 20 and the N− region 12.

Referring to Step G of FIG. 1, a polysilicon layer 26 is deposited onto the surface of the silicon device structure of Step F and, by conventional photolithographic masking and etching techniques, a portion of the polysilicon layer 26 is etched away to form the substantially V-shaped gate electrode configuration (with slightly overlapped edge portions) that is shown in Step G which substantially corresponds to the V-shaped groove in the semiconductor structure of Step E. This polysilicon layer 26 is suitably doped by diffusion techniques to function as the current carrying gate electrode of the MOS high power field effect transistor structure of one embodiment of this invention.

Referring to Step H of FIG. 1, by the use of conventional thermal oxide growth techniques, another silicon dioxide layer 28 is formed on the top surface of the polysilicon gate electrode 26 to provide an insulating layer that can be used for electrical insulation of the polysilicon gate electrode 26.

Figure 2:
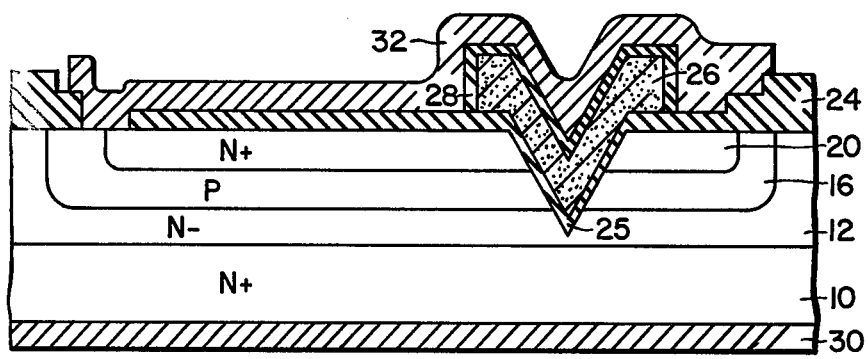
FIG. 2 is a cross-sectional, elevational view of the final MOS device structure of FIG. 1 with the top and bottom metal electrode contacts shown connected to active regions of the MOS device.

Referring to FIG. 2, the final structure of the MOS semiconductor device of the embodiment of FIG. 1 of this invention is depicted with the electrodes shown connected to the various regions of the high power MOS semiconductor device. In particular, the N+ substrate region 10 has a metal contact electrode 30 formed on the backside portion thereof. This metal contact electrode serves effectively to provide an electrical contact to the drain region of the high power MOS field effect transistor of this embodiment of the invention. This metal contact electrode 30 is preferably formed by the evaporation of aluminum and subsequent plating of nickel or any other desirable metal to form a thick metal electrode contact layer to the N+ substrate or drain region of the field effect transistor device of this invention.

A metal contact electrode 32 is formed on the top surface of the high power MOS semiconductor device of this embodiment of the invention. This metal contact electrode 32 as well as the metal contact electrode 30 are preferably formed by evaporating about 1 micron of aluminum onto the surface of the underlying surface and then plating nickel, for example, to a thickness of about 10 microns onto the supporting aluminum layer. As can be seen with reference to FIG. 2, due to the opening previously formed through the oxide layer 24 which is formed (where shown by the metal contact electrode 32 contacting the semiconductor surface at the portion thereof which includes the PN junction formed by the N+ region 20 and the P region 16) by conventional photolithographic oxide masking and etching techniques, the metal electrode 32 (that is evaporated and plated on the top surface of the MOS semiconductor structure) effectively shorts the N+ P junction and thereby functions to provide a source contact to the N+ region and also serves to short the P type body to the source to avoid having the P type body float which is undesirable in the formation of this high power MOS transistor structure.

The channel region of the MOS device of FIG. 2 extends on both sides of the apex portion in the P region 16 of the V-shaped groove. Thus, by applying a voltage of, for example, 10 volts on the polysilicon gate electrode 26, an N type channel is formed from the N+ region 20 through the N inverted channel region going through the P region 16 into the N− epi region 12. Hence, electrons flow across this channel between the source region (portions of N+ region 20) into the N− epi region 12 and through this region into the N+ (drain) region 10.

Figure 3:
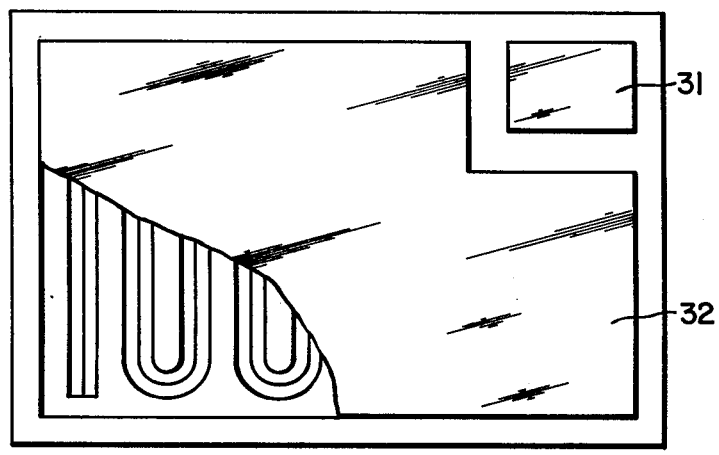
FIG. 3 is a top view of the surface of the MOS device of FIG. 2 as used in a chip showing the metal electrode contact to the polysilicon gate electrode located in a small (corner) portion of the top surface whereas a substantial portion of the remainder of the surface is covered with the large (heat sink) metal electrode contact for the source (and P region of the device).

Referring to FIG. 3, a top view of the semiconductor device of FIG. 2 (as used in a semiconductor chip) is shown. The sinuous V groove pattern used to increase the Z of the device is shown as it would look underneath the overlying metal electrode 32. A metal contact 31 is made to the polysilicon gate electrode layer 26 at a corner of the chip with substantially the entire surface of the chip being covered by the large (heat sink) metal electrode layer 32.

Figure 5:
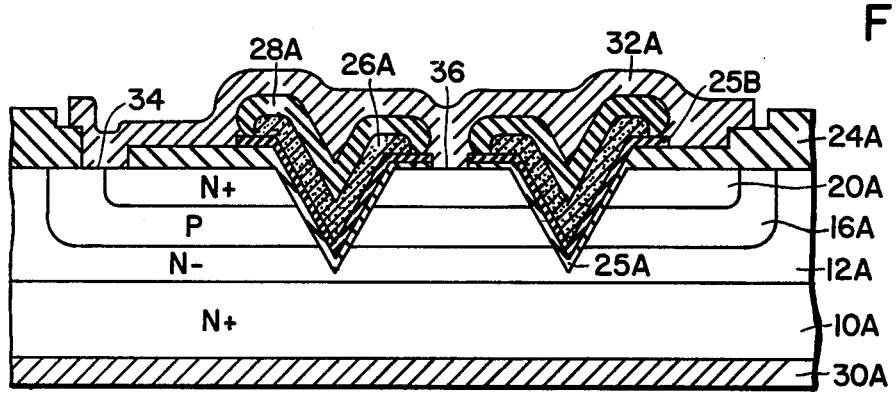
FIG. 5 is a view similar to FIG. 2 showing the final MOS device structure of FIG. 4.
Figure 4:
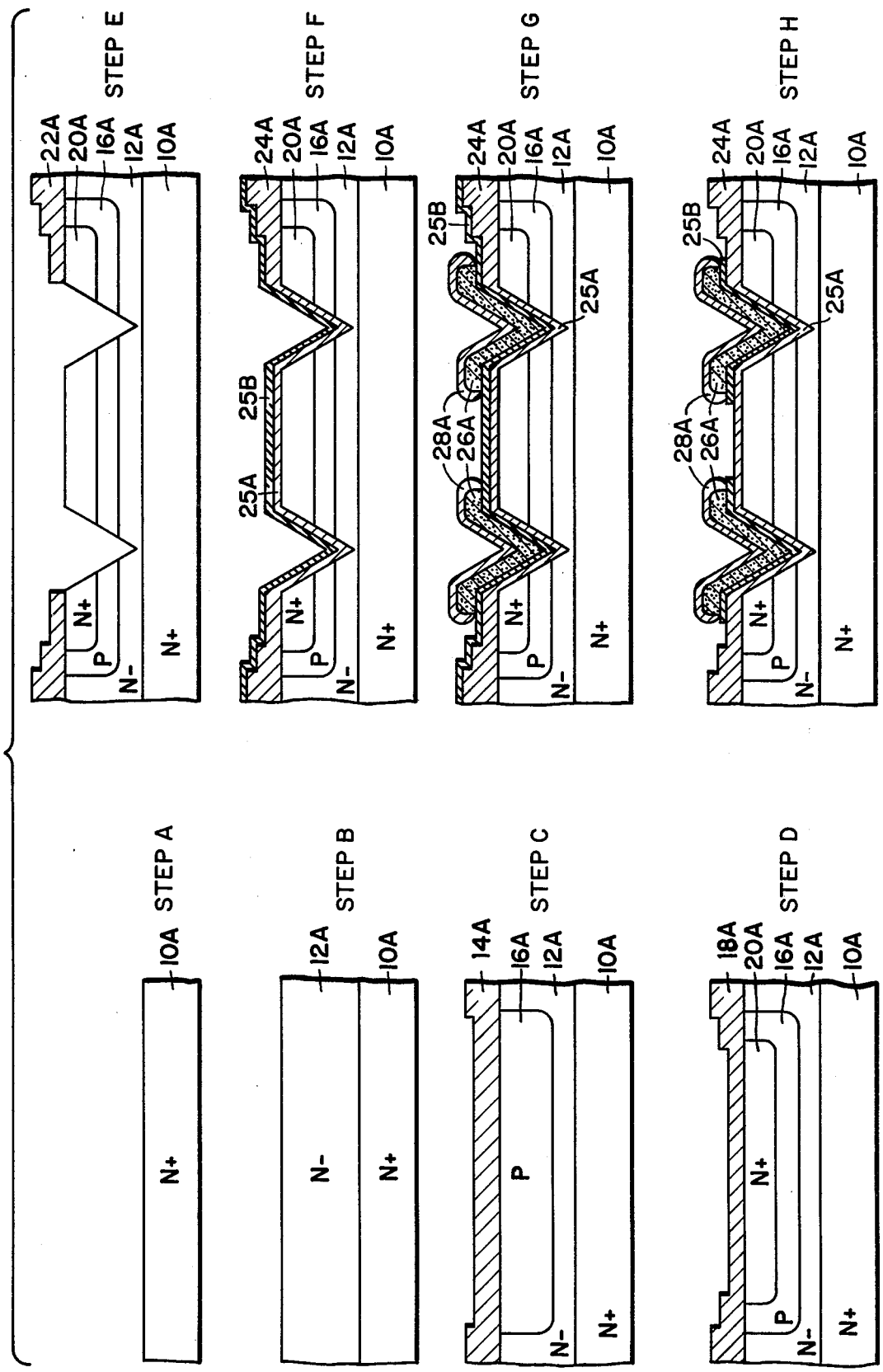
FIG. 4 is a view similar to FIG. 1 showing the fabrication steps for making a self-aligned, metal contact, MOS structure.

Referring to FIG. 4, a series of Steps A through H, similar to Steps A through H of FIG. 1, is shown depicting the Steps of the process used to form a VMOS device of the type shown in FIGS. 1 and 2. However, the VMOS device of FIGS. 4 and 5 is shown with two V shaped grooves (instead of one groove) penetrating through the emitter type N+ region 20A and the base type P region 16A. With reference to FIGS. 4 and 5, the same regions, metal layers, insulating layers, doped polysilicon layer, etc., as disclosed in FIGS. 1 and 2 are identified in FIGS. 4 and 5 with the same reference numeral plus the addition of the letter A. Thus, Steps A through D of FIG. 4 are the same as Steps A through D of FIG. 1 and carry the same reference numbers as used in FIG. 1 with the addition of the letter A.

In Step E of FIG. 4, two V shaped grooves are formed in the semiconductor structure and penetrate through the N+ region 20A and the P region 16A to form three portions of the N+ region 20A and three portions of the P region 16A. As noted before with reference to FIG. 1, the split portions of the N+ region 20A are connected together at the ends thereof to effectively provide a single (split) semiconductor very long sinuous, N+ region to serve as the source (or drain) of the VMOS device. Similarly, the split portions of the P region 16A are also connected together at the ends thereof to also provide a single (split) semiconductor very long, sinuous P region to function as the region where the channel is formed between the source (or drain) region 20A and the drain (or source) regions 12A and 10A. The center portion of the three split regions 20A does not have the silicon dioxide layer 22A located on the planar surface portion thereof. This center portion of the silicon dioxide layer 22A has been removed by a conventional photolithographic oxide masking and etching operation for the purpose of permitting a self-aligned metal contact to be formed (in subsequent Steps) to the center N+ region 20A.

Referring to Step F, a thermally grown thin silicon dioxide gate oxide layer 25A is formed in the two V grooves and then a thin insulating layer 25B of a different material than silicon dioxide is formed on the silicon dioxide gate oxide layer 25A and also on the silicon dioxide layer 24A on the surface of the semiconductor structure. Preferably, the insulating layer 25B is silicon nitride which is deposited such as by RF sputtering or by pyrolytic techniques. In this illustration embodiment, the underlying silicon dioxide gate oxide layer has a thickness of about 800 Angstroms and the overlying silicon nitride gate nitride layer has a thickness of about 400 Angstroms.

Referring to Step G, this Step is similar to Steps G and H of FIG. 1 with the additional showing of two doped polysilicon gate electrodes 26A in the two V grooves with the overlying silicon dioxide layer 28A. Additionally, the silicon nitride layer 25B is located beneath the two polysilicon gate electrodes 26A. In this view, there is a small, center, space formed between the two polysilicon gate electrodes 26A on the surface of the structure above the silicon nitride layer portion 25B. The function of the surface silicon nitride layer 25B serves also to effectively shield the underlying semiconductor structure from a thermal oxidation step which is used to form the spaced silicon dioxide layers 28A on the two polysilicon gate electrodes 26A. Thus, the silicon dioxide layer portions 28A are only formed on the two polysilicon gate electrodes 26A and there is little thermal oxide growth in the remaining top surface which is covered by the silicon nitride layer 25B.

Referring to Step H, only the exposed silicon nitride layer 25B is etched away from the surface of the semiconductor structure by using a silicon nitride etchant. Then, the thin surface oxide layer 25A located between the two polysilicon gate electrodes 26A is etched away with a conventional oxide etch thereby exposing the silicon surface located between the two polysilicon gate electrodes 26A. Since the oxide layer 28A is several times thicker than the thin surface oxide layer 25A, this oxide etch step does not remove the entire oxide layer 28A thereby permitting it to serve as a protecting oxide layer for the doped polysilicon regions 26A.

Referring to FIG. 5, the metal contacts 30A and 32A are formed as described with reference to FIG. 2. Consequently, an ohmic contact 34 is provided to both the P region 16A and the N+ region 20A (similar to the shortened electrical contact between the P region 16 and the N+ region 20 as shown in FIG. 2). Additionally, an ohmic electrical contact 36 is made to the center N+ region 20A. This is a self-aligned metal contact to the N+ region 20A and serves to significantly improve the conduction of current away from (or, if desired, into) the N+ region 20A.

The development of microprocessor automotive control systems has emphasized the need for a direct interface between microprocessors and displays or electromechanical actuators. The above described vertical metal oxide semiconductor or VMOS devices offers a combination of high input impedance, large output current, rapid switching of large currents, and immunity to current hogging and second breakdown problems. The electrical characteristics of these VMOS devices makes them especially attractive as a candidate for interfacing with microprocessors as well as other automotive applications. Since microprocessors have limited output drive capability, then the electrical characteristics of the output interface devices becomes important. Typical automotive type applications of the above described VMOS transistors includes their use in displays as either lamp drivers or as LED drivers. The above described VMOS transistor devices may also be used as relay or solenoid drivers, or as an AC motor controller. Another application of the above described VMOS transistor devices is the replacement of relays in automobiles.

The VMOS field effect transistors described above have the characteristics of a conventional MOS transistor while having significantly higher current density. The N+ substrate, N epi, P and N+ diffused regions of the above described VMOS transistors are similar to those of the bipolar transistor. Hence, the advantage in processing of VMOS and bipolar transistors is similar except for the etching of the V-groove and the subsequent gate oxidation and gate electrode formation. In the above described VMOS transistors, current is only needed to charge the gate to an appropriate voltage and then supply an extremely small leakage current. The current gain of a VMOS device can be as high as $10^5$ to $10^6$ under these conditions.

The above described VMOS devices with their extremely high input impedance are susceptible to permanent damage from transients in the input lead in the form of gate-oxide rupture unless adequate gate protection is present. Hence, a gate protection diode (not shown) will prevent damage to the gate of the VMOS devices by shunting transients to ground while maintaining the high input impedance.

The maximum transient that can be tolerated from drain to source in the above described VMOS transistors is controlled by such process variables as junction depth and substrate doping concentration. However, under similar operating conditions, the above described VMOS devices are less susceptible to permanent damage if the maximum operating voltage is exceeded for a period of time. The physical mechanisms that govern the behavior of the above described VMOS devices when a voltage transient occurs give it a negative temperature coefficient that results in a negative feedback condition; thus, reducing the possibility of a destructive thermal runaway situation.

Once an area of a bipolar transistor begins to carry a proportionally greater amount of current than neighboring areas, it heats up more, and this causes it to carry even more current (current hogging); resulting ultimately in the destruction of the device. Careful attention to bipolar transistor design can reduce the incidence of the current hogging phenomenon, but it is still a problem that must be dealt with. The above described VMOS transistors are relatively immune to the current hogging phenomenon because of the negative feedback mechanism associated with increased current density. The presence of this feedback mechanism has the added advantage that many of the above described VMOS transistors may be operated in parallel to drive a load without needing a delicate biasing scheme to guarantee that all devices are operating at the same level.

Bipolar devices require longer times to switch from the conducting to the non-conducting mode because of the time it takes the minority carriers in the transistor to either recombine or be swept out by electric fields. The above described VMOS devices are a majority carrier device, so minority carrier effects are not present. The above described VMOS devices will switch one to two hundred times faster than a bipolar device in similar operating conditions. The turn-on time of bipolar transistors is dominated by junction capacitance and the time it takes current to enter the base region. Since the capacitance and the charge transit time of the above described VMOS transistors are much smaller than those of a bipolar transistor, the turn-on time is also faster by one or two orders of magnitude.

| Comparison of Electrical Characteristics Between Bipolar Devices and the above Described VMOS Devices | | |
|---|---|---|
| | Bipolar | VMOS |
| Input impedance | $10^3 - 10^5$ ohms | $10^9 - 10^{11}$ ohms |
| Current gain | 100 – 2000 | $10^5 - 10^6$ |
| Resistance to input transients | Good | Good with use of a gate protection diode |
| Resistance to power lead transients | Medium (Second breakdown may occur) | High |
| Current hogging problems | Yes | No |
| Switching time On | Moderate (50 – 500 nsec typical) | Extremely fast (4 nsec) |
| Switching time Off | Moderate - slow (0.5 – 2.0 sec typical) | Extremely fast (4 nsec) |

A typical MOS microprocessor is capable of supplying 1 to 2 milliamps of current. This current is more than sufficient to drive one or more of the above described VMOS devices supplying many amperes to a load. Whereas, if a bipolar device is used, a Darlington configuration is required, and the drive requirements must be considered to insure that they are sufficient. The above described VMOS devices have a voltage rating of approximately 100 volts, a current capability of over 2 amps, and an 'on' resistance of less than 2 ohms. The above described VMOS is an ideal interface device especially if it is used in the complementary MOS configuration where the switching is fast and the power dissipation is low. It is readily apparent that a P-channel VMOS device can be fabricated in accordance with process of this invention using impurities or dopants of opposite conductivity type in forming the various regions. The use of both P and N-channel VMOS power devices permits their use as transmission gates, inverters, and push-pull power amplifiers.

While the invention has been particularly shown and described with reference to the preferred embodiments above, it will be understood by those skilled in the art that the foregoing and other changes in the form and details may be made therein without departing from the spirit and scope of the invention.

We claim:

1. A high power MOS semiconductor device comprising, in combination, a semiconductor substrate, spaced source and drain regions of one conductivity type located in said semiconductor substrate, substantially V-shaped channel region having a region thereof of opposite conductivity type connected to said source region and to said drain region and providing a groove in said semiconductor substrate, a first insulating layer located in said groove in said semiconductor substrate and on said substantially V-shaped channel region, a doped electrically conductive polysilicon gate electrode layer located in said groove and on said first insulating layer, a second insulating layer located on and covering said polysilicon gate electrode layer, a first electrode electrically connected to one of said source and drain regions, and a second electrode electrically connected to the other of said source and drain regions, one of said first and second electrodes being located on said second insulating layer and covering substantially the entire surface area over one surface of said semiconductor substrate.

2. A high power MOS semiconductor device in accordance with claim 1 wherein said one of said first and second electrodes located on said second insulating layer being electrically connected to one of said source and drain regions and to one of said regions of opposite conductivity type.

3. A high power MOS semiconductor device in accordance with claim 2 wherein said one of said first and second electrodes being the source electrode and the other of said first and second electrodes being the drain electrode.

4. A high power MOS semiconductor device in accordance with claim 3 wherein said spaced source and drain regions are of N type conductivity and said regions of said opposite conductivity type of said V-shaped channel region being of P type conductivity.

5. A high power MOS semiconductor device in accordance with claim 1 wherein said spaced source and drain regions of said one conductivity type being located on opposite sides of said V-shaped channel region, said regions of said V-shaped channel region of opposite conductivity type surrounding a substantial portion of said spaced source and drain regions of said one conductivity type, a high resistivity region of said one conductivity type having a higher resistivity than the resistivity of said spaced source and drain regions surrounding a substantial portion of said regions of opposite conductivity type, and a low resistivity region of said one conductivity type having a lower resistivity than the resistivity of said high resistivity region of said one conductivity type located in contact with said high resistivity region of said one conductivity type.

6. A high power MOS semiconductor device in accordance with claim 5 wherein said one of said first and second electrodes located on said second insulating layer being electrically connected to one of said source and drain regions and to one of said regions of opposite conductivity type, said one of said first and second electrodes being the source electrode and the other of said first and second electrodes being the drain electrode, said spaced source and drain regions are of N type conductivity and said regions of said opposite conductivity type of said V-shaped channel region being of P type conductivity, and a third electrode electrically connected to said polysilicon gate electrode through an opening in said second insulating layer located over said one surface of said semiconductor substrate.

7. A high power MOS semiconductor device comprising, in combination, a semiconductor substrate, spaced source and drain regions of one conductivity type located in said semiconductor substrate, a pair of spaced substantially V-shaped channel regions, each of said pair of spaced substantially V-shaped channel regions having a region thereof of opposite conductivity type connected to said source region and to said drain region and providing a groove in said semiconductor substrate, a first insulating layer located in each groove in said semiconductor substrate and on each of said pair of spaced substantially V-shaped channel regions, a second insulating layer located in each groove and on said first insulating layer, a doped electrically conductive polysilicon gate electrode layer located in each said groove and on said second insulating layer, a third insulating layer located on and covering said polysilicon gate electrode layer, a first electrode electrically connected to one of said source and drain regions, and a second electrode electrically connected to the other of said source and drain regions, one of said first and second electrodes being located on said third insulating layer and covering substantially the entire surface area over one surface of said semiconductor substrate.

8. A high power MOS semiconductor device in accordance with claim 7 wherein said one of said first and second electrodes located on said third insulating layer being electrically connected to one of said source and drain regions and to one of said regions of opposite conductivity type.

9. A high power MOS semiconductor device in accordance with claim 7 wherein said one of said first and second electrodes located on said third insulating layer being electrically connected to one of said source and drain regions on a substrate surface portion between said pair of spaced substantially V-shaped channel regions.

10. A high power MOS semiconductor device in accordance with claim 9 wherein said one of said first and second electrodes being the source electrode and the other of said first and second electrodes being the drain electrode.

11. A high power MOS semiconductor device in accordance with claim 10 wherein said spaced source and drain regions are of N type conductivity and said regions of said opposite conductivity type of said V-shaped regions being of P type conductivity.

12. A high power MOS semiconductor device in accordance with claim 7 wherein said first insulating layer being silicon dioxide and said second insulating layer being silicon nitride.

13. A high power MOS semiconductor device in accordance with claim 9 wherein said first insulating layer being silicon dioxide, said second insulating layer being silicon nitride, and said third insulating layer being silicon dioxide.

14. A VMOS semiconductor device comprising, in combination, a semiconductor substrate region, spaced source and drain regions of one conductivity type located in said semiconductor substrate region, substantially V-shaped channel region having a region thereof of opposite conductivity type connected to said source region and to said drain region and providing a groove in said semiconductor substrate region, at least one insulating layer located in said groove in said semiconductor substrate region and on said substantially V-shaped channel region, a doped electrically conductive polysilicon gate electrode layer located in said groove and on said insulating layer, another insulating layer located on and covering said polysilicon gate electrode layer, a first electrode electrically connected to one of said source and drain regions, and a second electrode electrically connected to the other of said source and drain regions, one of said first and second electrodes being located on said another insulating layer.

* * * * *